United States Patent
Gu et al.

(10) Patent No.: US 9,437,146 B2
(45) Date of Patent: *Sep. 6, 2016

(54) SHIFT REGISTER, GATE DRIVER AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xiaofang Gu, Beijing (CN); Rui Ma, Beijing (CN); Ming Hu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/840,586

(22) Filed: Aug. 31, 2015

(65) Prior Publication Data

US 2015/0371596 A1 Dec. 24, 2015

Related U.S. Application Data

(63) Continuation of application No. 14/107,093, filed on Dec. 16, 2013, now Pat. No. 9,153,342.

(30) Foreign Application Priority Data

Dec. 14, 2012 (CN) .......................... 2012 1 0546379

(51) Int. Cl.
G09G 3/36 (2006.01)
G11C 19/28 (2006.01)
G11C 19/20 (2006.01)

(52) U.S. Cl.
CPC ........... *G09G 3/3611* (2013.01); *G09G 3/3648* (2013.01); *G09G 3/3677* (2013.01); *G09G3/3688* (2013.01); *G11C 19/20* (2013.01); *G11C 19/28* (2013.01); *G09G 2310/0264* (2013.01); *G09G 2310/0283* (2013.01); *G09G 2310/0286* (2013.01); *G09G 2320/0209* (2013.01)

(58) Field of Classification Search
None
See application file for complete search history.

(56) References Cited

U.S. PATENT DOCUMENTS 6,754,049 B1 * 6/2004 Seagle ................. G11B 5/1278
360/317
9,153,342 B2 * 10/2015 Gu ........................ G09G 3/3611

FOREIGN PATENT DOCUMENTS

CN 1868003 A 11/2006
CN 102629459 A 8/2012

OTHER PUBLICATIONS

First Chinese Office Action dated Nov. 15, 2014; Appln. No. 201210546379.7.

(Continued)

*Primary Examiner* — Muhammad N Edun
(74) *Attorney, Agent, or Firm* — Ladas & Parry LLP (57) ABSTRACT

Disclosed are a shift register, a gate driver and a display device, which relate the field of display technology and may eliminate the voltage coupled noise generated by a clock signal at an output terminal of the shift register effectively. The shift register comprises: a first input unit, a clock control unit, a second input unit, an inverting unit, a pulling-down unit and a first level selecting unit, a second level selecting unit, a third level selecting unit; the first input unit is connected with a first input signal terminal, the first level selecting unit and the second input unit, respectively, wherein a node at which the first input unit is connected with the second input unit is a pulling-up node, the first input unit is used for controlling a potential at the pulling-up node. The embodiments of the present disclosure may be applied to various display devices.

15 Claims, 4 Drawing Sheets (56) References Cited

OTHER PUBLICATIONS

Second Chinese Office Action dated Apr. 16, 2015; Appln. No. 201210546379.7.
Partial European Search Report dated Apr. 15, 2014; Appln. No. 13197608.6-1904.
USPTO NFOA dated Feb. 2, 2015 in connection with U.S. Appl. No. 14/107,093.
USPTO NOA mailed May 26, 2015 in connection with U.S. Appl. No. 14/107,093.

* cited by examiner

| transferring the clock signal to the output terminal of the shift register when the output terminal is required to output a gate driving signal | S11 |

| insulating the clock signal from the output terminal of the shift register and discharging the output terminal when the output terminal is not required to output the gate driving signal | S12 |

Fig.8

SHIFT REGISTER, GATE DRIVER AND DISPLAY DEVICE

TECHNICAL FIELD

The present disclosure relates to a field of display technology, and particularly, to a shift register, a gate driver and a display device.

BACKGROUND

Liquid crystal displays have been used widely in various fields of manufacturing and living, and display is implemented in a liquid crystal display by using driving circuits to drive respective pixels in a liquid crystal panel. Driving circuits of a liquid crystal display majorly comprise a gate driving circuit and a data driving circuit, wherein the data driving circuit is used to latch input image data in accordance with timings of a clock signal and convert the latched data into analog signals so as to input the same to data lines of the liquid crystal panel, and the gate driving circuit is used to convert the clock signal into a turn-on/turn-off voltage through a shift register (SR) and output the same to a corresponding gate line of the liquid crystal panel. Wherein only a current stage of shift register outputs the turn-on voltage at a same time, that is to say, only the voltage on the gate line corresponding to one row of pixels is the turn-on voltage, and voltages on the gate lines corresponding to remaining rows of pixels are all the turn-off voltage, so that the data signal at this moment is only input to the row of pixels through the data driving circuit. At a next moment, a next stage of shift register outputs a scanning signal so that the voltage on the gate line corresponding to a next row of pixels is the turn-on voltage, and the voltages on the gate lines corresponding to remaining rows of pixels are all the turn-off voltage. The rest may be deduced similarly, and a progressive scanning of the pixels in the liquid crystal panel may be achieved. The above turn-on voltage occurs on the respective rows sequentially and progressively and is also referred to as a scanning signal. A scanning direction for progressively scanning the pixels in the liquid crystal panel either may be from top to bottom, or may be from bottom to top, so that the image displayed on a display device may has different orientations with respect to the display device.

In the structure described above, the main method for converting the clock signal into the scanning signal by the shift register is to trigger an operation of a current stage of shift register in response to the output of the scanning signal from a previous stage of shift register, and then output the clock signal of the current stage of shift register as the scanning signal, and at the same time, the scanning signal at the current stage is fed back to the previous stage of shift register on one hand so as to reset the previous stage of shift register, and is input to the next stage of shift register as a first input signal for the next stage of shift register on the other hand. Similarly, the respective stages of shift registers output the scanning signal sequentially.

However, as well-known by those skilled in the art, the clock signal is a square wave which is switched periodically between a first level and a second level, and there are many clock cycles in a scanning period during which the scanning signal cycles from a first row of pixels to a last row of pixels. With respect to a certain shift register, only a time period being half of the clock cycle is used to output the scanning signal, but the output terminal of the shift register may generally output a fluctuated level under an effect of the clock signal in remaining clock cycles during which no scanning signal should be output, such that a great circuit noise occurs on the corresponding gate line and the thin film transistors in the pixel units may be turned on improperly, and in turn the circuit functions abnormally.

SUMMARY

A major object of embodiments of the present disclosure is to provide a shift register, a gate driver and a display device, which may eliminate the voltage-coupled noise generated by a clock signal at an output terminal of the shift register effectively and enable the shift register to operate more stably.

In view of this, the embodiments of the present disclosure adopt solutions as follows.

In an aspect of the embodiments of the present disclosure, there is provided a shift register, comprising: a first input unit, a clock control unit, a second input unit, an inverting unit, a pulling-down unit and a first level selecting unit, a second level selecting unit, a third level selecting unit;

the first input unit is connected with a first input signal terminal, the first level selecting unit and the second input unit, respectively, wherein a node at which the first input unit is connected with the second input unit is a pulling-up node, the first input unit is used for controlling a potential at the pulling-up node;

a first terminal of the clock control unit is connected with the pulling-up node, a second terminal thereof is connected with a clock signal terminal, and a third terminal thereof is connected with the pulling-down unit, wherein the third terminal of the clock control unit is an output terminal of the shift register, and the clock control unit is used for controlling whether to transmit a clock signal from the clock signal terminal to the output terminal of the shift register;

the second input unit is connected with a second input signal terminal, the second level selecting unit, the pulling-up node, respectively, and is used for controlling the potential at the pulling-up node;

the inverting unit is connected with the third level selecting unit, a low level signal terminal, the pulling-up node and the pulling-down unit, respectively, wherein a node at which the inverting unit is connected with the pulling-down unit is a pulling-down node, the inverting unit is used for making level of the voltage at the pulling-up node and level of the voltage at the pulling-down node be inverted to each other;

the pulling-down unit is connected with the pulling-up node, the pulling-down node, the low level signal terminal, the first input signal terminal, the second input signal terminal and the output terminal of the shift register, respectively, and is used for pulling down the voltage at the output terminal of the shift register;

the first level selecting unit is connected with the first input unit, and is used for selecting the low level signal terminal or a high level signal terminal to be connected to the first input unit;

the second level selecting unit is connected with the second input unit, and is used for selecting the low level signal terminal or the high level signal terminal to be connected to the second input unit;

the first level selecting unit and the second level selecting unit make the level of the signal terminal connected to the first input unit and the level of the signal terminal connected to the second input unit be inverted to each other;

the third level selecting unit is connected with the inverting unit, and is used for selecting the low level signal terminal or the high level signal terminal to be connected to the inverting unit.

In a further aspect according to the embodiments of the present disclosure, there is provided an operation method of the shift register, comprising:

transferring the clock signal to the output terminal of the shift register when the output terminal of the shift register is required to output a gate driving signal;

insulating the clock signal from the output terminal of the shift register and discharging the output terminal when the output terminal of the shift register is not required to output the gate driving signal.

In another aspect according to the embodiments of the present disclosure, there is provided a gate driver comprising a plurality of stages of shift registers provided in the embodiments of the present disclosure, which are connected with each other in cascade.

In a still aspect according to the embodiments of the present disclosure, there is provided a display device comprising the gate driver provided in the embodiments of the present disclosure.

With the shift register, the operation method thereof, the gate driver and the display device provided in the embodiments of the present disclosure, the clock signal may be transferred to the output terminal of the shift register by the clock control unit when the output terminal is required to output the gate driving signal, and the clock signal is insulated from the output terminal by the clock control unit and the output terminal is discharged through the pulling-down unit when the output terminal is not required to output the gate driving signal, while a bi-directional shift can be implemented. Thus, the output terminal of the shift register is always in a discharging state and always remains at a low level as long as it is not its turn to output the gate driving signal, so that the voltage coupled noise generated by the clock signal may be eliminated effectively and the shift register may operate more stably, which may increase a lifespan of the shift register effectively.

BRIEF DESCRIPTION OF THE DRAWINGS

In order to explain solutions in embodiments of the present disclosure or the prior art more clearly, drawings required as describing the embodiments of the present disclosure or the prior art will be introduced briefly below. Obviously, the drawings described below are only some embodiments of the present disclosure, but those ordinary skilled in the art may obtain other drawings according to these drawings without any inventive labors.

DETAILED DESCRIPTION

Below solutions in embodiments of the present disclosure will be described clearly and completely in connection with drawings of the embodiments of the present disclosure.

It should be noted that the embodiments described below are only part of the embodiments of the present disclosure but not all of the embodiments of the present disclosure.

Figure 1:
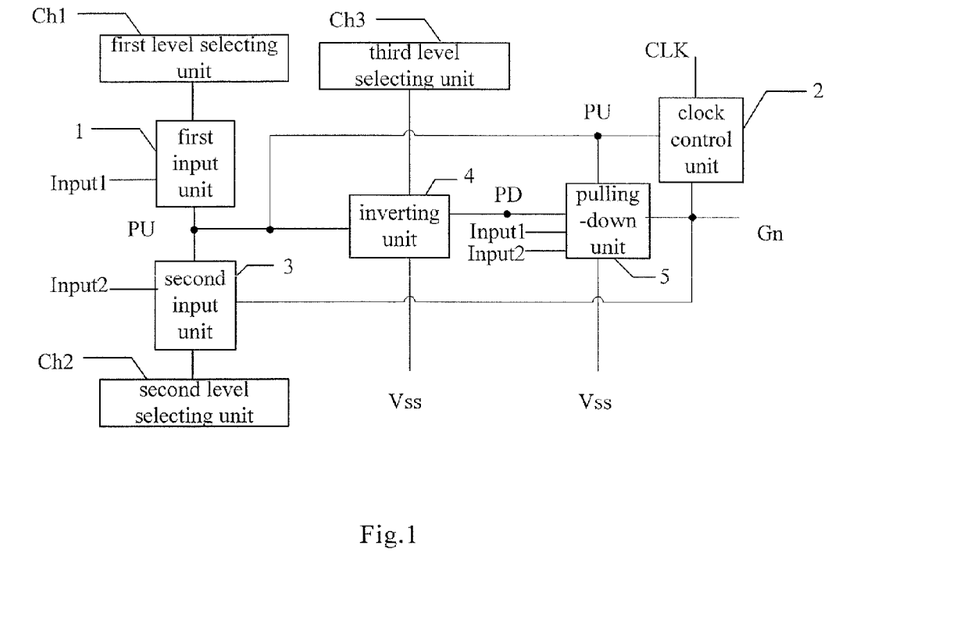
FIG. 1 is a schematic diagram illustrating a circuit of a shift register according to embodiments of the present disclosure.

As illustrated in FIG. 1, in an embodiment of the present disclosure, there is provided a shift register, comprising: a first input unit 1, a clock control unit 2, a second input unit 3, an inverting unit 4, a pulling-down unit 5 and a first level selecting unit Ch1, a second level selecting unit Ch2, and a third level selecting unit Ch3.

The first input unit 1 is connected with a first input signal terminal INput1, the first level selecting unit Ch1 and the second input unit 3, respectively, wherein a node at which the first input unit 1 is connected with the second input unit 3 is a pulling-up node PU, the first input unit 1 is used for controlling a potential at the pulling-up node PU;

a first terminal of the clock control unit 2 is connected with the pulling-up node PU, a second terminal thereof is connected with a clock signal terminal CLK, and a third terminal thereof is connected with the pulling-down unit 5, wherein a node at which the third terminal of the clock control unit 2 is connected with the pulling-down unit 5 is an output terminal Gn of the shift register, and the clock control unit 2 is used for controlling whether to transmit a clock signal from the clock signal terminal CLK to the output terminal Gn of the shift register;

the second input unit 3 is connected with a second input signal terminal Input2, the second level selecting unit Ch2 and the pulling-up node PU, respectively, and the second input unit 3 may be used for controlling the potential at the pulling-up node PU.

The inverting unit 4 is connected with the third level selecting unit Ch3, a low level signal terminal Vss, the pulling-up node PU and the pulling-down unit 5, respectively, wherein a node at which the inverting unit 4 is connected with the pulling-down unit 5 is a pulling-down node PD, the inverting unit 4 may be used for making level of the voltage at the pulling-up node PU and level of the voltage at the pulling-down node PD be inverted.

The pulling-down unit 5 is connected with the pulling-up node PU, the pulling-down node PD, the low level signal terminal Vss, the first input signal terminal Input1, the second input signal terminal Input2 and the output terminal Gn of the shift register, respectively, and is used for pulling down the voltage at the output terminal Gn of the shift register.

The first level selecting unit Ch1 is connected with the first input unit 1, and is used for selecting the low level signal terminal Vss or a high level signal terminal Vdd to be connected to the first input unit 1; the second level selecting unit Ch2 is connected with the second input unit 3, and is used for selecting the low level signal terminal Vss or the high level signal terminal Vdd to be connected to the second input unit 3; the first level selecting unit Ch1 and the second level selecting unit Ch2 make the level of the signal terminal connected to the first input unit 1 and the level of the signal terminal connected to the second input unit 3 be inverted; the third level selecting unit Ch3 is connected with the inverting unit 4, and is used for selecting the low level signal terminal Vss or the high level signal terminal Vdd to be connected to the inverting unit 4.

With the shift register provided in the embodiments of the present disclosure, the clock signal from the clock signal terminal CLK may be transferred to the output terminal Gn of the shift register by the clock control unit 2 when the output terminal Gn is required to output a gate driving signal, and the clock signal from the clock signal terminal CLK may be insulated from the output terminal Gn by the clock control unit 2 and the output terminal Gn is discharged through the pulling-down unit 5 when the output terminal Gn is not required to output the gate driving signal, while a bi-directional scanning is achieved. Thus, the output terminal Gn of the shift register is always in a discharging state and always remains at a low level as long as it is not its turn to output the gate driving signal, so that the voltage-coupled noise generated by the clock signal CLK may be eliminated effectively and the shift register may operate more stably, which may increase a lifespan of the shift register effectively.

It should be noted that, in the embodiments of the present disclosure, driving levels input to the first input unit 1, the second input unit 3 and the inverting unit 4 may be selected by the first, second, third level selecting units Ch1, Ch2, Ch3, respectively. These three level selecting units may be any circuits for providing different levels to other circuits, such as a multi-path switch and the like. Wherein the selections made by the first level selecting unit Ch1 and the second level selecting unit Ch2 may directly decide that a shift direction of the shift register is a forward shift or a backward shift. If it is the forward shift, the gate driving signal output from a previous stage of shift register is input via the Input1 of the first input unit 1 of a current stage of shift register, and the gate driving signal output from a next stage of shift register is input via the Input2 of the second input unit 3 of the current stage of shift register; if it is the backward shift, the gate driving signal output from a previous stage of shift register is input via the Input2 of the second input unit 3 of the current stage of shift register, and the gate driving signal output from a next stage of shift register is input via the Input1 of the first input unit 1 of the current stage of shift register.

During the forward shift, the gate driving signal output from the previous stage of shift register is used for triggering the current stage of shift register to output the gate driving signal, therefore the gate driving signal output from the previous stage of shift register may also be referred to as a shift triggering signal for the current stage of shift register. And, the gate driving signal output from the next stage of shift register is used for making the current stage of shift register stop outputting the gate driving signal, therefore the gate driving signal output from the next stage of shift register may also be referred to as a reset signal for the current stage of shift register.

On the contrary, during the backward shift, the gate driving signal output from the next stage of shift register is used for triggering the current stage of shift register to output the gate driving signal, therefore the gate driving signal output from the next stage of shift register may also be referred to as a shift triggering signal for the current stage of shift register. And, the gate driving signal output from the previous stage of shift register is used for making the current stage of shift register stop outputting the gate driving signal, therefore the gate driving signal output from the previous stage of shift register may also be referred to as a reset signal for the current stage of shift register.

In particular, the first input unit 1, the clock control unit 2, the second input unit 3, the inverting unit 4 and the pulling-down unit 5 described above may be implemented in various circuit structures.

Figure 2:
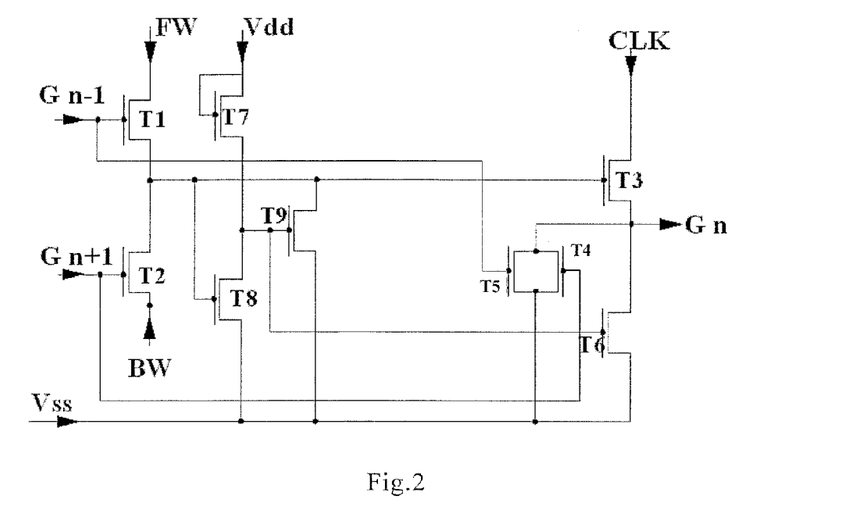
FIG. 2 is a detailed circuit diagram of the shift register according to the embodiments of the present disclosure.

For example, FIG. 2 is a detailed circuit diagram of the shift register according to the embodiments of the present disclosure. It should be noted that, in FIG. 2 and following drawings, FW and BW denote levels selectable by the first level selecting unit Ch1, the second level selecting unit Ch2, and the third level selecting unit Ch3, respectively, and each of FW and BW may be equivalent to a high level or a low level in different embodiments.

As illustrated in FIG. 2, in an embodiment of the present disclosure, the first input unit 1 may be a first thin film transistor T1, a gate thereof is connected with the first input signal terminal Input1 and is used for receiving the gate driving signal output from the output terminal Gn−1 of the previous stage of shift register, a drain thereof is connected with the first level selecting unit Ch1, and a source thereof is connected with the pulling-up node PU. The second input unit 3 may be a second thin film transistor T2, wherein a gate of the second thin film transistor T2 is connected with the second input signal terminal Input2 and is used for receiving the gate driving signal output from the output terminal Gn+1 of the next stage of shift register, a drain thereof is connected with the pulling-up node PU, and a source thereof is connected with the second level selecting unit Ch2.

In the present embodiment, if the forward shift is implemented, the gate driving signal output from the output terminal Gn−1 of the previous stage of shift register is input as the first input signal via the first thin film transistor T1 for triggering the current stage of shift register to output the gate driving signal, and the gate driving signal output from the output terminal Gn+1 of the next stage of shift register is input as the second input signal via the second thin film transistor T2; while if the backward shift is implemented, the gate driving signal output from the output terminal Gn−1 of the previous stage of shift register is input as the second input signal via the second thin film transistor T2, and the gate driving signal output from the output terminal Gn+1 of the next stage of shift register is input as the first input signal via the first thin film transistor T1 for trigger the current stage of shift register to output the gate driving signal.

The clock control unit 2 may be a third thin film transistor T3, a gate thereof is connected with the pulling-up node PU, a source thereof is connected with the clock signal terminal CLK, and a drain thereof is connected with the output terminal Gn of the shift register. Particularly, the third thin film transistor T3 is used for transferring the clock signal from the clock signal terminal CLK to the output terminal Gn when a voltage at the pulling-up node PU is at a first level, and insulating the clock signal terminal CLK from the output terminal Gn when the voltage at the pulling-up node PU is at a second level. In an example, the first level is different from the second level, for example, the first level and the second level are inverted to each other, that is, if the first level may be a high level, the second level may be a low level, and vice versa. For a purpose of convenience, the first level refers to the high level and the second level refers to the low level hereinafter, unless the context clearly indicates otherwise.

In particular, the inverting unit 4 may have various circuit structures. For example, as illustrated in FIG. 2, the inverting unit 4 may comprise a seventh thin film transistor T7 and an eighth thin film transistor T8, wherein a gate and a drain of the seventh thin film transistor T7 are connected with the third level selecting unit Ch3 together, and a source thereof is connected with the pulling-down node PD; a gate of the eighth thin film transistor T8 is connected with the pulling-up node PU, a drain thereof is connected with the pulling-down node PD, and a source thereof is connected with the low level signal terminal Vss.

In the present embodiment, the third level selecting unit Ch3 enables the high level signal terminal Vdd to be connected to the inverting unit 4. Thus, when the pulling-up node PU is at the first level, the eighth thin film transistor T8 is turned on, its ON-resistance decreases correspondingly, therefore a voltage drop across the eighth thin film transistor T8 decreases when a voltage dividing is performed by the eighth thin film transistor T8 and the seventh thin film transistor T7, such that the voltage at the pulling-down node PD drops. Further, the dropping of the voltage at the pulling-down node PD would cause the pulling-down unit 5 to insulate the pulling-up node PU from the low level signal terminal. Vss, therefore the pulling-up node PU is ensured not to be discharged, which may remain its voltage being at the first level.

On the contrary, when the pulling-up node PU is at the second level, the eighth thin film transistor T8 is not turned on and its resistance is large, therefore the voltage drop across the eighth thin film transistor T8 is increased when the voltage dividing is performed by the eighth thin film transistor T8 and the seventh thin film transistor T7, such that the voltage at the pulling-down node PD rises. Further, the rising of the voltage at the pulling-down node PD would cause the pulling-down unit 5 to pull down the voltages at the pulling-up node PU and the output terminal Gn.

In particular, the pulling-down unit 5 may be used for pulling down the voltage at the pulling-up node PU and the voltage at the output terminal Gn according to the voltage at the pulling-down node PD, and pulling down the voltage at the output terminal Gn according to the first input signal from the first input signal terminal Input1 and the second input signal from the second input signal terminal Input2.

For example, as illustrated in FIG. 2, the pulling-down unit 5 may comprise a fourth thin film transistor T4, a fifth thin film transistor T5, a sixth thin film transistor 16 and a ninth thin film transistor T9, wherein a gate of the fourth thin film transistor T4 is connected with the second input signal terminal Input2, a drain thereof is connected with the output terminal Gn, and a source thereof is connected with the low level signal terminal Vss; a gate of the fifth thin film transistor T5 is connected with the first input signal terminal Input1, a drain thereof is connected with the output terminal Gn, and a source thereof is connected with the low level signal terminal Vss; a gate of the sixth thin film transistor T6 is connected with the pulling-down node PD, a drain thereof is connected with the output terminal Gn, and a source thereof is connected with the low level signal terminal Vss; a gate of the ninth thin film transistor T9 is connected with the pulling-down node PD, a drain thereof is connected with the pulling-up node PU, and a source thereof is connected with the low level signal terminal Vss.

The fifth thin film transistor T5 is turned on so as to pull down the voltage at the output terminal Gn when the first input signal from the first input signal terminal Input1 is at the first level, and is turned off so as to insulate the output terminal Gn from the low level signal terminal Vss when the first input signal from the first input signal terminal Input1 is at the second level. The fourth thin film transistor T4 is turned on so as to pull down the voltage at the output terminal Gn when the second input signal from the second input signal terminal Input2 is at the first level, and is turned off so as to insulate the output terminal Gn from the low level signal terminal Vss when the second input signal from the second input signal terminal Input2 is at the second level.

The gate of the sixth thin film transistor T6 is connected with the pulling-down node PD, the drain thereof is connected with the output terminal Gn, and the source thereof is connected with the low level signal terminal Vss. The sixth thin film transistor T6 is turned on so as to pull down the voltage at the output terminal Gn when the voltage at the pulling-down node PD is at the first level, and is turned off so as to insulate the output terminal Gn from the low level signal terminal Vss when the voltage at the pulling-down node PD is at the second level.

The gate of the ninth thin film transistor T9 is connected with the pulling-down node PD, the drain thereof is connected with the pulling-up node PU, and the source thereof is connected with the low level signal terminal Vss. The ninth thin film transistor T9 is turned on so as to pull down the voltage at the pulling-up node PU when the voltage at the pulling-down node PD is at the first level, and is turned off so as to insulate the pulling-up node PU and the output terminal Gn from the low level signal terminal Vss when the voltage at the pulling-down node PD is at the second level.

It should be noted that the thin film transistors mentioned in the previous embodiments are manufactured by a standard process, therefore the source and the drain have a same structure and may be interchanged with each other. That is to say, the source of the thin film transistor may be replaced with the drain, and the drain of the thin film transistor may be replaced with the source in the embodiments of the present disclosure.

Of course, the first input unit 1, the second input unit 3 and the clock control unit 2, the inverting unit 4, the pulling-down unit 5 may utilize other circuit structures in other embodiments of the present disclosure, as long as they can realize their respective functions, respectively, and the present disclosure is not limited thereto.

Figure 3:
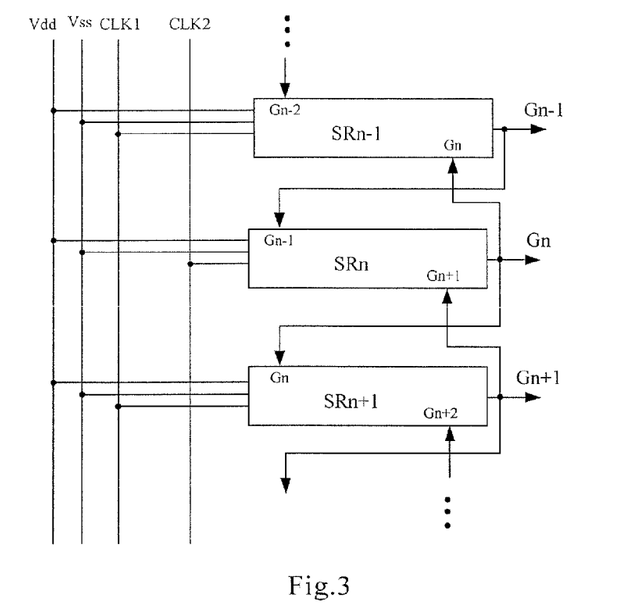
FIG. 3 is a schematic diagram illustrating a series circuit of the shift registers for a forward shift according to the embodiments of the present disclosure.

It should be noted that, in a driving circuit of a display device, a plurality of stages of shift registers are connected with each other in cascade and operate so as to drive pixels in respective rows in the display device. FIG. 3 illustrates a schematic diagram of a series circuit of a plurality of stages of shift registers for the forward shift or scanning. As illustrated in FIG. 3, an output signal from an output terminal Gn−1 of a previous stage of shift register is input to a first input unit 1 of a current stage of shift register, as a first input signal of the current stage of shift register, and an output signal from an output terminal Gn+1 of a next stage of shift register is input to a second input unit 3 of a current stage of shift register, as a second input signal of the current stage of shift register.

In order to enable two adjacent shift registers to output gate driving signals sequentially and continuously under effect of the clock signal, a next stage of shift register is needed to be still driven by the high level of the clock signal after a current stage of shift register is driven by the high level of the clock signal, which is difficult to be implemented when the clock signal is switched between the high level and the low level periodically. Therefore, two clock signals with a phase difference of 180° may be provided to the adjacent shift registers, respectively.

Figure 4:
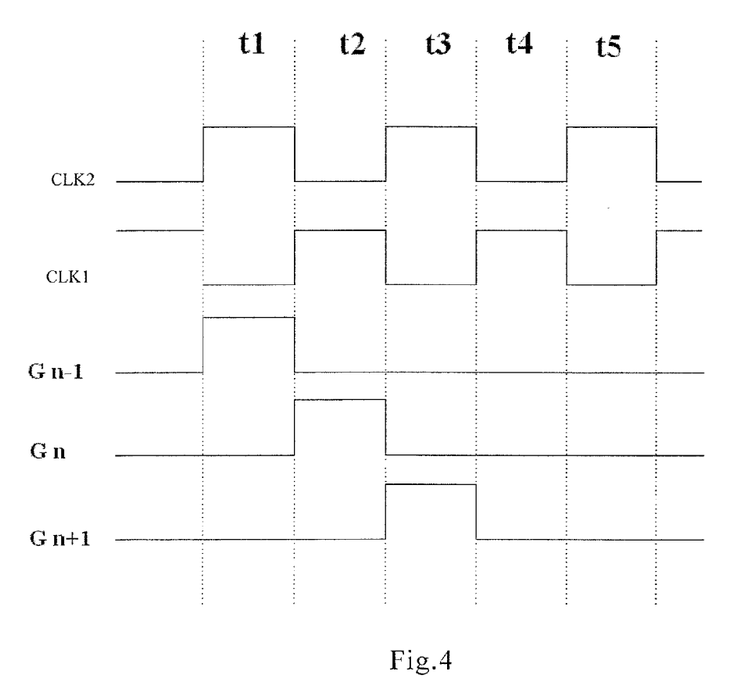
FIG. 4 is a timing diagram of signals in the shift registers for the forward shift according to the embodiments of the present disclosure.

During the forward shift, when the shift register operates normally, its respective input signals, such as the first input signal (that is, the output signal from the output terminal Gn−1 of the previous stage of shift register), the second input signal (that is, the output signal from the output terminal Gn+1 of the next stage of shift register), and the clock signal at the clock signal terminal CLK1 and the clock signal at the clock signal terminal CLK2 follow a certain timing regularity. FIG. 4 illustrates a timing relationship among the above input signals. Thereafter an operation process of the shift register according to the embodiments of the present disclosure will be explained in details in connection with the FIGS. 1-4

As illustrated in FIG. 4, during a t1 phase, the first input signal (that is, the output signal from the output terminal Gn−1 of the previous stage of shift register) is at the high level, which represents that the output terminal Gn−1 of the previous stage SRn−1 of shift register outputs the high level. According to the progressive scanning characteristic of the gate scanning signal, only one stage of shift register may output the high level at a same time, therefore remaining stages of shift registers are impossible to output the high level, except the previous stage of shift register outputs the high level. Considering a fact that the second input signal (that is, the output signal from the output terminal Gn+1 of the next stage of shift register) is also the output signal from the next stage SRn+1 of shift register, the second input signal is unlikely to be at the high level. Since the signal from the output terminal of each stage of shift register is formed by the corresponding clock signal, outputting of the high level from the output terminal Gn−1 of the previous stage of shift register may also represent that the clock signal from the clock signal terminal CLK1 for driving the previous stage of shift register should be at the high level during the t1 phase, while the clock signal from the clock signal terminal CLK2 for driving the current stage SRn of shift register should be at the low level during the t1 phase.

During the t1 phase, for the current stage SRn of shift register, the first input signal (that is, the output signal from the output terminal Gn−1 of the previous stage of shift register) is at the high level, the second input signal (that is, the output signal from the output terminal Gn+1 of the next stage of shift register) is at the low level, and the clock signal from the clock signal terminal CLK2 for driving the current stage SRn of shift register is at the low level. Actions of respective parts of the circuit are as follows. The first input signal is at the high level, so that T1 and T5 in the pulling-down unit 5 are turned on, particularly the first thin film transistor T1 is turned on so that the high level of Vdd is input to the pulling-up node PU, and in turn to remain the pulling-up node PU being at the high level during the t1 phase. At the same time, the high level of the pulling-up node PU may turn on the eighth thin film transistor T8 in the inverting unit 4, and a potential at the pulling-down node PD may be at a low potential at this moment by designing sizes of the seventh thin film transistor T7 and the eighth thin film transistor T8, such that the ninth thin film transistor T9 and the sixth thin film transistor T6 are turned off, that is, the output terminal Gn and the pulling-up node PU of the current stage SRn of shift register are insulated from the low level signal terminal Vss, respectively, so that the voltage at the pulling-up node PU may be remained being at the high level. At the same time, the fifth thin film transistor T5 is turned on, then the output terminal Gn discharges so as to remain at the low level Vss, so that the voltage coupled noise generated by the clock signal from the clock signal terminal CLK2 may be eliminated effectively and the shift register may operate more stably.

During a t2 phase, the current stage SRn of shift register should output the gate driving signal during the t2 phase after the previous stage SRn−1 of shift register outputs the gate driving signal during the t1 phase. Accordingly, during this phase, for the current stage SRn of shift register, the first input signal (that is, the output signal from the output terminal Gn−1 of the previous stage of shift register) is at the low level, the second input signal (that is, the output signal from the output terminal Gn+1 of the next stage of shift register) is at the low level, the clock signal from the clock signal terminal CLK2 for driving the current stage SRn of shift register is at the high level, so the output terminal Gn of the current stage SRn of shift register is at the high level.

In this case, on one hand, the low level of the first input signal turns off T1 and T5, and the pulling-up node PU goes on to remain being at the high level at this time because the T9 in the pulling-down unit 5 is still turned off, the pulling-down node PD goes on to remain being at the low level under an effect of the inverting unit 4 so that T9 and T6 is remained to be turned off, thus the output terminal Gn of the current stage SRn of shift register is insulated from the low level signal terminal Vss. Turning off of T5 enables the output terminal Gn of the current stage SRn of shift register to be insulated from the low level signal terminal Vss. Now, all paths between the output terminal Gn of the current stage SRn of shift register and the low level signal terminal Vss are disconnected, then it is prepared to output the gate driving signal at the output terminal Gn.

On the other hand, the clock signal from the clock signal terminal CLK2 is at the high level, the potential at the pulling-up node PU is higher during this phase than the potential at the pulling-up node PU during the t1 phase by a bootstrapping effect of a parasitic capacitance between the gate and source of T3, so that T3 is turned on, the clock signal from the clock signal terminal CLK2 is transferred to the output terminal Gn of the current stage SRn of shift register, as the gate driving signal output from the current stage SRn of shift register.

Optionally, in order to emphasize the bootstrapping effect, the shift register further comprises a bootstrapping capacitor in an embodiment of the present disclosure, wherein one terminal of the bootstrapping capacitor is connected with the pulling-up node, and the other terminal is connected with the clock signal terminal.

During a t3 phase, after the current stage SRn of shift register outputs the gate driving signal during the t2 phase, the next stage SRn+1 of shift register outputs the gate driving signal, which is also feedback to the current stage SRn of shift register as the second input signal of the current stage of shift register. Accordingly, during this phase, Gn−1 is at the low level, Gn+1 is at the high level, the clock signal from the clock signal terminal CLK1 for driving the next stage SRn+1 of shift register is at the high level, and the output terminal Gn+1 of the next SRn+1 of shift register is at the high level.

In this case, for the current stage SRn of shift register, the first input signal is at the low level, the second input signal is at the high level, the clock signal from the clock signal terminal CLK2 is at the low level, and the output terminal Gn also becomes the low level. The high level of the output terminal Gn+1 of the next stage SRn+1 of shift register turns on the T2 and T4 in the second input unit 3 of the current stage SRn of shift register, the pulling-up node PU and the output terminal OUT of the current stage SRn of shift register are discharged, therefore both of the pulling-up node PU and the output terminal Gn of the current stage SRn of shift register drop to the low level. Because the potential at the PU node drops to the low level, T8 in the inverting unit 4 is turned off, the resistance of T8 is increased, a voltage-dividing result between T7 and T8 is that the pulling-down node PD becomes the high level, so that T9 and 16 in the pulling-down unit 5 are turned on, and the pulling-up node PU and the output terminal Gn are further discharged and remain being at the low level.

During a t4 phase, it is neither the current stage SRn of shift register nor the previous stage SRn−1 or the next stage SRn+1 of shift register with respect to the current stage SRn of shift register that outputs the gate driving signal. Therefore, during this phase, Gn−1 is at the low level, Gn+1 is at the low level. At the same time, the clock signal from the clock signal terminal CLK2 for driving the current stage SRn of shift register is at the high level.

At this time, for the current stage SRn of shift register, T3 is turned off because the pulling-up node PU of the current stage SRn of shift register becomes the low level during the t3 phase, a high level signal at the second clock signal terminal CLK2 would not be transmitted to the output terminal Gn; T6 and T9 in the pulling-down unit 5 still remain to be turned on because the pulling-down node PD remains the high level as during the t3 phase, so that the voltage coupled noise generated by the clock signal from the clock signal terminal CLK2 may be eliminated effectively and both of the pulling-up node PU and the output terminal Gn may remain the low level signal as during the t3 phase.

During a t5 phase, it is neither the current stage of shift register nor the previous or next stage of shift register with respect to the current stage of shift register that outputs the gate driving signal. Therefore, during this phase, Gn−1 is at the low level, Gn+1 is at the low level. At the same time, the clock signal from the clock signal terminal CLK2 for driving the current stage SRn of shift register is at the high level.

During this phase, remaining signals are same as those during the t4 phase, except the clock signal from the clock signal terminal CLK2 is at the low level, which is different from the case during the t4 phase. T3 is turned off because the pulling-up node PU is at the low level, the low level signal at the CLK2 terminal would not be transmitted to the output terminal Gn. T6 and T9 in the pulling-down unit 5 still remain to be turned on because the pulling-down node PD remains the high level, so that the voltage coupled noise generated by the clock signal from CLK2 may be eliminated effectively and both of the pulling-up node PU and the output terminal Gn may remain the low level signal as during the t3 phase, and thus the gate driving signal is output stably.

During following clock cycles, the operation states of the current stage of shift register are similar to the operation states during the t4 and t5 phases, particularly the operation state during the t4 phase and the operation state during the t5 phase occur alternately, until a first input signal in a next scanning cycle brings the current stage of shift register to the t1 phase back.

Figure 5:
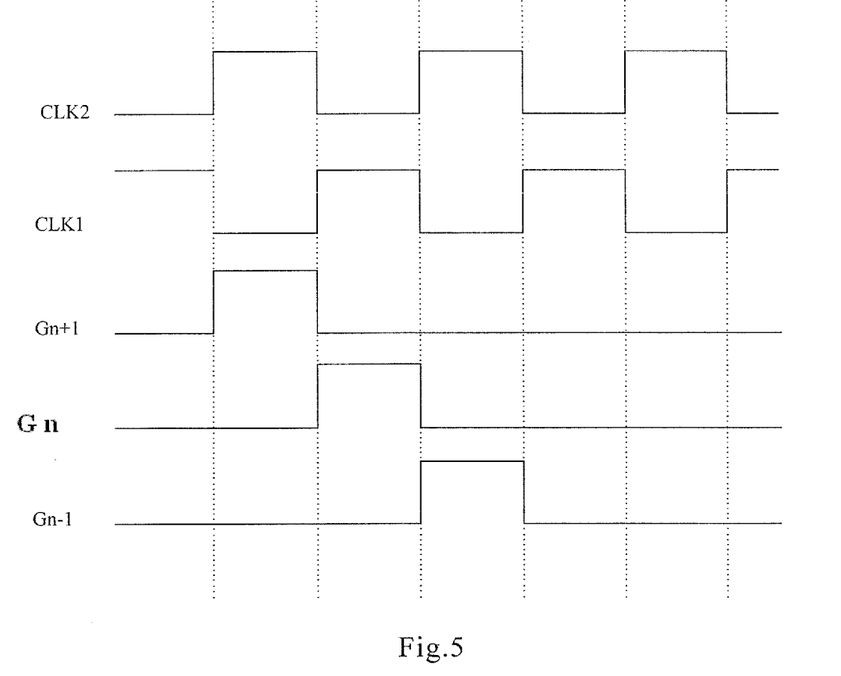
FIG. 5 is a timing diagram of signals in the shift registers for a backward shift according to the embodiments of the present disclosure.

In the present embodiment, if the backward shift is implemented, only the input signal for T1 and the input signal for T2 are required to be exchanged and the high level signal terminal connected to T1 and the low level signal terminal connected to T2 are required to be exchanged, and operations of other units in the circuit are not affected. The timing relationship of the signals for this case may refer to FIG. 5, and details are omitted herein.

In the above embodiments, the respective transistors are always in an operating state no matter whether the forward shift or the backward shift is implemented. In order to reduce the power consumption of the transistors and increase a lifespan of the shift registers, in an example, some redundant circuit structure may be designed for the shift register provided in the embodiments of the present disclosure, so that the forward shift and the backward shift may be implemented by two different groups of transistors, which operate alternately.

Figure 6:
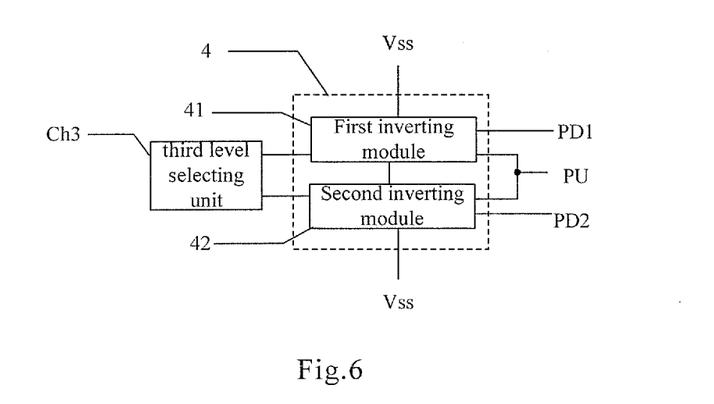
FIG. 6 is a schematic diagram illustrating a partial circuit of the shift register according to the embodiments of the present disclosure.

As illustrated in FIG. 6, in an embodiment of the present disclosure, the inverting unit 4 comprises a first inverting module 41 and a second inverting module 42, the first inverting module 41 and the second inverting module 42 are connected with the pulling-up node PU, respectively. A node at which the first inverting module 41 is connected with the pulling-down unit 5 is a first pulling-down node PD1, and a node at which the second inverting module 42 is connected with the pulling-down unit 5 is a second pulling-down node PD2; the first inverting module 41 is connected with the third level selecting unit Ch3, the first pulling-down node PD1 and the low level signal terminal Vss, respectively; the second inverting module 42 is connected with the third level selecting unit Ch3, the second pulling-down node PD2 and the low level signal terminal Vss, respectively; the third level selecting unit Ch3 makes the level input to the first inverting module 41 and the level input to the first input unit 1 being same, and make the level input to the second inverting module 42 and the level input to the second input unit 3 being same. Thus, the level input to the first inverting module 41 is as same as the level input to the first input unit 1, and both of them are FW, while the level input to the second inverting module 42 is as same as the level input to the second input unit 3, and both of them are BW, and level of FW and level of BW are inverted. Thus, when the forward shift is implemented, FW is at the high level, BW is at the low level, one terminal of the first inverting module 41 is connected with the FW signal, and the other terminal thereof is connected with the low level signal terminal Vss, therefore the first inverting module 41 may operate normally; one terminal of the second inverting module 42 is connected with the BW signal, and the other terminal thereof is connected with the low level signal terminal Vss, therefore the second inverting module 42 does not operate because both of the signals are at the low level. When the backward shift is implemented, FW is at the low level, BW is at the high level, one terminal of the first inverting module 41 is connected with the FW signal, and the other terminal thereof is connected with the low level signal terminal Vss, therefore the first inverting module 41 does not operate because both of the signals are at the low level one terminal of the second inverting module 42 is connected with the BW signal, and the other terminal thereof is connected with the low level signal terminal Vss, therefore the second inverting module 42 may operate normally.

Figure 7:
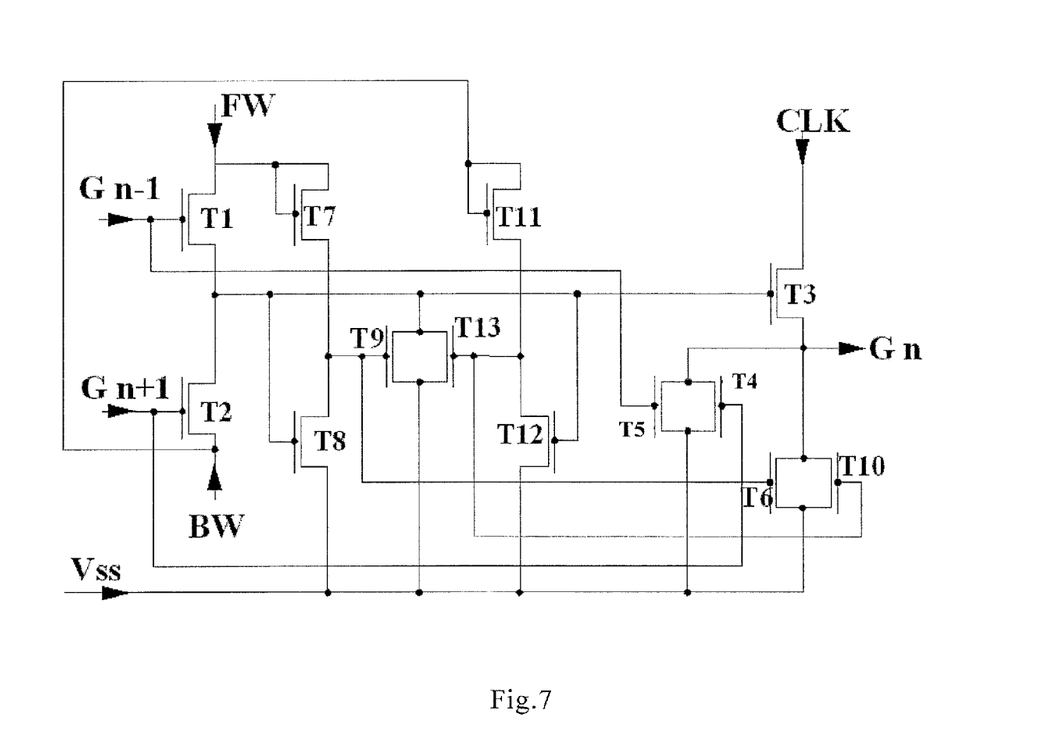
FIG. 7 is another detailed circuit diagram of the shift register according to the embodiments of the present disclosure.

In particular, as illustrated in FIG. 7, the first inverting module 41 may comprise the seventh thin film transistor T7 and the eighth thin film transistor T8, wherein the gate and the drain of the seventh thin film transistor T7 are connected with the third level selecting unit Ch3 together, and the source thereof is connected with the first pulling-down node PD1; the gate of the eighth thin film transistor T8 is connected with the pulling-up node PU, the drain thereof is connected with the first pulling-down node PD1, and the source thereof is connected with the low level signal terminal Vss; the second inverting module 42 may comprise an eleventh thin film transistor T11 and a twelfth thin film transistor T12, wherein a gate and a drain of the eleventh thin film transistor T11 are connected with the third level selecting unit Ch3 together, and a source thereof is connected with the second pulling-down node PD2; a gate of the twelfth thin film transistor T12 is connected with the pulling-up node PU, a drain thereof is connected with the second pulling-down node PD2, and a source thereof is connected with the low level signal terminal Vss. The thin film transistors T7 and T8 operate while the thin film transistors T11 and T12 are suspended when the forward shift is implemented, and the thin film transistors T7 and T8 are suspended while the thin film transistors T11 and T12 operate when the backward shift is implemented. Thus, through the symmetrical design, the forward shift and the backward shift are implemented by two different groups of transistors alternately, so that the power consumption of each group of transistors may be reduced and the lifespan of the circuit may be increased effectively.

Similarly, in the present embodiment, some redundant circuit structure may also be designed for the detailed circuit of the pulling-down unit 5 similarly. The pulling-down unit 5 may comprise the fourth thin film transistor T4, the fifth thin film transistor T5, the sixth thin film transistor T6, the ninth thin film transistor T9, a tenth thin film transistor T10, and a thirteenth thin film transistor T13, wherein the gate of the fourth thin film transistor T4 is connected with the output terminal Gn+1 of the next stage SRn+1 of shift register, the drain thereof is connected with the output terminal Gn of the current stage SRn of shift register, and the source thereof is connected with the low level signal terminal Vss; the gate of the fifth thin film transistor T5 is connected with the output terminal Gn−1 of the previous stage SRn−1 of shift register, the drain thereof is connected with the output terminal Gn of the current stage SRn of shift register, and the source thereof is connected with the low level signal terminal Vss; the gate of the sixth thin film transistor T6 is connected with the first pulling-down node PD1, the drain thereof is connected with the output terminal Gn of the current stage SRn of shift register, and the source thereof is connected with the low level signal terminal Vss; the gate of the ninth thin film transistor T9 is connected with the first pulling-down node PD1, the drain thereof is connected with the pulling-up node PU, and the source thereof is connected with the low level signal terminal Vss; a gate of the tenth thin film transistor T10 is connected with the second pulling-down node PD2, a drain thereof is connected with the output terminal Gn of the current stage SRn of shift register, and a source thereof is connected with the low level signal terminal Vss; a gate of the thirteenth thin film transistor T13 is connected with the second pulling-down node PD2, a drain thereof is connected with the pulling-up node PU, and a source thereof is connected with the low level signal terminal Vss.

The thin film transistors T4, T5, T6, T9 operates while the thin film transistors T10 and T13 are suspended when the forward shift is implemented, and the thin film transistors T6 and T9 are suspended while the thin film transistors T4, T5, T10, T13 operate when the backward shift is implemented. Thus, the forward shift and the backward shift are implemented by two different groups of the transistors alternately, so that the power consumption of each group of transistors may be reduced and the lifespan of the circuit may be increased effectively.

Figure 8:
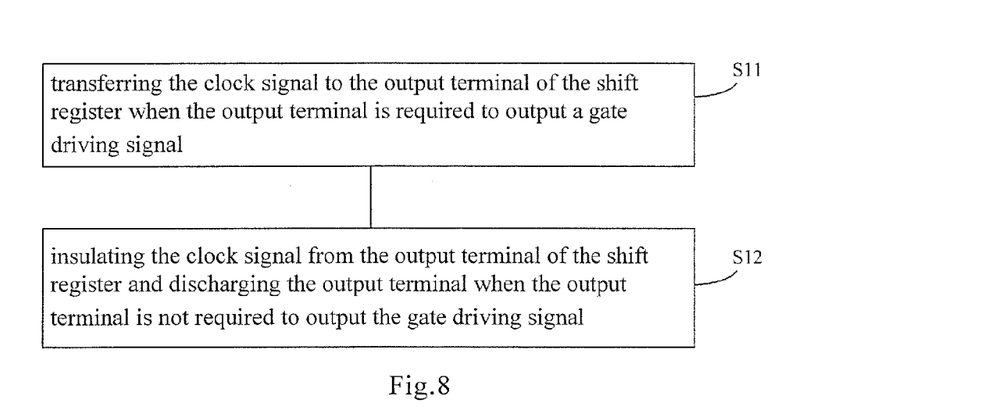
FIG. 8 is a flowchart illustrating an operation method of the shift register according to the embodiments of the present disclosure.

Correspondingly, in the embodiments of the present disclosure, there is further provided a method for operating the above shift register, as illustrated in FIG. 8, comprising the following steps:

S11, transferring the clock signal to the output terminal of the shift register when the output terminal of the shift register is required to output the gate driving signal;

S12, insulating the clock signal from the output terminal of the shift register and discharging the output terminal when the output terminal is not required to output the gate driving signal.

With the method for operating the shift register provided in the embodiments of the present disclosure, the clock signal may be transferred to the output terminal of the shift register when the output terminal is required to output the gate driving signal, while the clock signal is insulated from the output terminal and the output terminal is discharged when the output terminal is not required to output the gate driving signal. Thus, the output terminal of the shift register is always in a discharging state and always remains a low level as long as it is not its turn to output the gate driving signal, so that the voltage coupled noise generated by the clock signal at the output terminal of the shift register may be eliminated effectively and the shift register may operate more stably, which may increase a lifespan of the shift register effectively.

In particular, in the step S11, after the gate driving signal output from the previous stage of shift register is input to the first input unit and before the gate driving signal output from the next stage of shift register is input to the second input unit, the output terminal of the current stage of shift register may be insulated from the low level signal terminal by the pulling-down unit, and the clock signal is controlled to be transferred to the output terminal of the current stage of shift register by the clock control unit.

In an example, the first level selecting unit selects the high level signal terminal to be connected to the first input unit, the second level selecting unit selects the low level signal terminal to be connected to the second input unit, and the third level selecting unit selects the high level signal terminal to be connected to the inverting unit.

In particular, when the clock control unit transfers the clock signal to the output terminal of the shift register, the voltage at the pulling-up node may be raised on a basis of the original high potential at the pulling-up node by a jump transition of the clock signal, so that the clock control unit may transfer the clock signal to the output terminal of the shift register.

In the method for operating the shift register as provided in the embodiments of the present disclosure, the output terminal of the shift register is required to output the gate driving signal only in S11, while the output terminal of the shift register is not required to output the gate driving signal in the step S12. The clock signal may be insulated from the output terminal of the current stage of shift register and the output terminal of the current stage of shift register may be discharged in various manners in the step S12, according to whether the gate driving signal is output from the output terminal of the current stage of shift register, the output terminal of the previous stage of shift register and the output terminal of the next stage of shift register.

In an example, when the gate driving signal output from the previous stage of shift register is input to the first input unit, the first input unit may control the voltage at the pulling-up node to be at the high level, the clock control unit may control the clock signal to be insulated from the output terminal of the current stage of shift register, and the output terminal of the current stage of shift register may be discharged through the pulling-down unit.

In an example, when the gate driving signal output from the next stage of shift register is input to the second input unit, the second input unit may control the voltage at the pulling-up node to be at the low level, the clock control unit may control the clock signal to be insulated from the output terminal of the current stage of shift register, and the output terminal of the current stage of shift register may be discharged through the pulling-down unit.

In an example, after the gate driving signal output from the next stage of shift register is input to the second input unit, the clock signal may be insulated from the output terminal of the current stage of shift register by the clock control unit, and the output terminal of the current stage of shift register may be discharged through the pulling-down unit.

As a result, the shift register according to the embodiments of the present disclosure may remain its output terminal to be in the discharging state and always at the low level when the output terminal of the shift register is not required to output the gate driving signal in the different timings, so that the voltage coupled noise generated by the clock signal at the output terminal of the shift register may be eliminated effectively and the shift register may operate more stably.

The operation method for the shift register has been explained in details in the description for the shift register previously, so details are omitted herein.

In the embodiments of the present disclosure, there is further provided a gate driver correspondingly, comprising a plurality of stages of shift registers provided in the embodiments of the present disclosure, which are connected with each other in cascade. Therefore, the gate driver may also realize the benefit effects of the shift register In the embodiments of the present disclosure, there is further a display device correspondingly, comprising any one of the gate driver provided in the embodiments of the present disclosure.

The above descriptions only illustrate the specific embodiments of the present disclosure, and the protection scope of the present disclosure is not limited thereto. Given the teaching as disclosed herein, variations or substitutions, which can easily occur to any skilled pertaining to the art, should be covered by the protection scope of the present disclosure. Thus, the protection scope of the present disclosure is defined by the claims.

What is claimed is:

1. A shift register, comprising: a first input unit, a clock control unit, a second input unit, an inverting unit, a pulling-down unit and a first level selecting unit, a second level selecting unit, a third level selecting unit; wherein the first input unit is connected with a first input signal terminal, the first level selecting unit and the second input unit, respectively, wherein a node at which the first input unit is connected with the second input unit is a pulling-up node, the first input unit is used for controlling a potential at the pulling-up node;

a first terminal of the clock control unit is connected with the pulling-up node, a second terminal thereof is connected with a clock signal terminal, and a third terminal thereof is connected with the pulling-down unit, wherein a node at which the third terminal of the clock control unit is connected with the pulling-down unit is an output terminal of the shift register, and the clock control unit is used for controlling whether to transmit a clock signal from the clock signal terminal to the output terminal of the shift register;

the second input unit is connected with a second input signal terminal, the second level selecting unit, the pulling-up node, respectively, and is used for controlling the potential at the pulling-up node;

the inverting unit is connected with the third level selecting unit, a low level signal terminal, the pulling-up node and the pulling-down unit, respectively, wherein a node at which the inverting unit is connected with the pulling-down unit is a pulling-down node, the inverting unit is used for making level of the voltage at the pulling-up node and level of the voltage at the pulling-down node be inverted to each other;

the pulling-down unit is connected with the pulling-up node, the pulling-down node, the low level signal terminal, the first input signal terminal, the second input signal terminal and the output terminal of the shift register, respectively, and is used for pulling down the voltage at the output terminal of the shift register;

the first level selecting unit is connected with the first input unit, and is used for selecting the low level signal terminal or a high level signal terminal to be connected to the first input unit;

the second level selecting unit is connected with the second input unit, and is used for selecting the low level signal terminal or the high level signal terminal to be connected to the second input unit;

the first level selecting unit and the second level selecting unit make the level of the signal terminal connected to the first input unit and the level of the signal terminal connected to the second input unit be inverted to each other;

the third level selecting unit is connected with the inverting unit, and is used for selecting the low level signal terminal or the high level signal terminal to be connected to the inverting unit;

wherein the pulling-down unit comprises a fourth thin film transistor, a fifth thin film transistor, a sixth thin film transistor and a ninth thin film transistor, wherein a gate of the fourth thin film transistor is connected with the second input signal terminal, a drain thereof is connected with the output terminal, and a source thereof is connected with the low level signal terminal; a gate of the fifth thin film transistor is connected with the first input signal terminal, a drain thereof is connected with the output terminal, and a source thereof is connected with the low level signal terminal; a gate of the sixth thin film transistor is connected with the pulling-down node, a drain thereof is connected with the output terminal, and a source thereof is connected with the low level signal terminal; a gate of the ninth thin film transistor is connected with the pulling-down node, a drain thereof is connected with the pulling-up node, and a source thereof is connected with the low level signal terminal, wherein when the output terminal of the shift register is not required to output the gate driving signal, the clock control unit insulates the clock signal from the output terminal of the shift register, and the output terminal is discharged; when the output terminal of the shift register is required to output the gate driving signal, the pulling-down unit insulates the output terminal of the shift register from the low level signal terminal, and the clock control unit transfers the clock signal to the output terminal of the shift register, wherein the first level selecting unit selects the low level signal terminal to be connected to the first input unit, the second level selecting unit selects the high level signal terminal to be connected to the second input unit, and the third level selecting unit selects the high level signal terminal to be connected to the inverting unit.

2. The shift register of claim 1, wherein the first input unit comprises a first thin film transistor, a gate thereof is connected with the first input signal terminal, a drain thereof is connected with the first level selecting unit, and a source thereof is connected with the pulling-up node.

3. The shift register of claim 1, wherein the clock control unit comprises a third thin film transistor, a gate thereof is connected with the pulling-up node, a source thereof is connected with the clock signal terminal, and a drain thereof is the output terminal of the shift register.

4. The shift register of claim 1, wherein the second input unit comprises a second thin film transistor, wherein a gate of the second thin film transistor is connected with the second input signal terminal, a drain thereof is connected with the pulling-up node, and a source thereof is connected with the second level selecting unit.

5. The shift register of claim 1, wherein the inverting unit comprises a seventh thin film transistor and a eighth thin film transistor, wherein a gate and a drain of the seventh thin film transistor are connected with the third level selecting unit together, and a source thereof is connected with the pulling-down node; a gate of the eighth thin film transistor is connected with the pulling-up node, a drain thereof is connected with the pulling-down node, and a source thereof is connected with the low level signal terminal.

6. The shift register of claim 5, wherein the third level selecting unit makes the high level signal terminal be connected to the inverting unit.

7. The shift register of claim 1, wherein the inverting unit comprises a first inverting module and a second inverting module, the first inverting module and the second inverting module are connected with the pulling-up node, respectively; a node at which the first inverting module is connected with the pulling-down unit is a first pulling-down node, and a node at which the second inverting module is connected with the pulling-down unit is a second pulling-down node;

the first inverting module is connected with the third level selecting unit, the first pulling-down node and the low level signal terminal, respectively;

the second inverting module is connected with the third level selecting unit, the second pulling-down node and the low level signal terminal, respectively;

the third level selecting unit makes the level input to the first inverting module and the level input to the first input unit same, and makes the level input to the second inverting module and the level input to the second input unit same.

8. The shift register of claim 7, wherein the first inverting module comprises a seventh thin film transistor and an eighth thin film transistor, wherein a gate and a drain of the seventh thin film transistor are connected with the third level selecting unit together, and a source thereof is connected with the first pulling-down node; a gate of the eighth thin film transistor is connected with the pulling-up node, a drain thereof is connected with the first pulling-down node, and a source thereof is connected with the low level signal terminal;

the second inverting module comprises an eleventh thin film transistor and a twelfth thin film transistor, wherein a gate and a drain of the eleventh thin film transistor are connected with the third level selecting unit together, and a source thereof is connected with the second pulling-down node; a gate of the twelfth thin film transistor is connected with the pulling-up node, a drain thereof is connected with the second pulling-down node, and a source thereof is connected with the low level signal terminal.

9. The shift register of claim 7, wherein the pulling-down unit further comprises a tenth thin film transistor and a thirteenth thin film transistor, wherein the gate of the sixth thin film transistor is connected with the first pulling-down node, the drain thereof is connected with the output terminal, and the source thereof is connected with the low level signal terminal;

the gate of the ninth thin film transistor is connected with the first pulling-down node, the drain thereof is connected with the pulling-up node, and the source thereof is connected with the low level signal terminal;

a gate of the tenth thin film transistor is connected with the second pulling-down node, a drain thereof is connected with the output terminal, and a source thereof is connected with the low level signal terminal; and a gate of the thirteenth thin film transistor is connected with the second pulling-down node, a drain thereof is connected with the pulling-up node, and a source thereof is connected with the low level signal terminal.

10. The shift register of claim 1, wherein when the first input signal input to the first input unit is active, the clock control unit controls the clock signal to be insulated from the output terminal of the shift register, and the pulling-down unit discharges the output terminal of the shift register, when the second input signal input to the second input unit is active, the clock control unit controls the clock signal to be insulated from the output terminal of the shift register, and the pulling-down unit discharges the output terminal of the shift register, when neither the first input signal input to the first input unit nor the second input signal input to the second input unit is active, the clock control unit insulates the clock signal from the output terminal of the shift register, and the pulling-down unit discharges the output terminal of the shift register.

11. A gate driver comprising a plurality of stages of shift registers of claim 1 connected with each other in cascade.

12. The gate driver of claim 11, wherein for each stage of shift register, when the output terminal of the current stage of shift register is required to output the gate driving signal, that is, after the gate driving signal output from a next stage of shift register is input to the second input unit and before the gate driving signal output from a previous stage of shift register is input to the first input unit, the pulling-down unit insulates the output terminal of the current stage of shift register from the low level signal terminal, and the clock control unit transfers the clock signal to the output terminal of the current stage of shift register, wherein the first level selecting unit selects the low level signal terminal to be connected to the first input unit, the second level selecting unit selects the high level signal terminal to be connected to the second input unit, and the third level selecting unit selects the high level signal terminal to be connected to the inverting unit.

13. The gate driver of claim 11, wherein for each stage of shift register, when the gate driving signal output from a next stage of shift register is input to the second input unit of the current stage of shift register, the second input unit controls the voltage at the pulling-up node to be at a high level, the clock control unit controls the clock signal to be insulated from the output terminal of the current stage of shift register, and the pulling-down unit discharges the output terminal of the current stage of shift register, when the gate driving signal output from a previous stage of shift register is input to the first input unit, the first input unit controls the voltage at the pulling-up node to be at a low level, the clock control unit controls the clock signal to be insulated from the output terminal of the current stage of shift register, and the pulling-down unit discharges the output terminal of the current stage of shift register, after the output terminal of the previous stage of shift register is input to the first input unit, the clock control unit insulates the clock signal from the output terminal of the current stage of shift register, and the pulling-down unit discharges the output terminal of the current stage of shift register.

14. A display device comprising the gate driver of claim 11.

15. The display device of claim 14, wherein for each stage of shift register, after the gate driving signal output from a next stage of shift register is input to the second input unit and before the gate driving signal output from a previous stage of shift register is input to the first input unit, the pulling-down unit insulates the output terminal of the current stage of shift register from the low level signal terminal, and the clock control unit transfers the clock signal to the output terminal of the current stage of shift register, wherein the first level selecting unit selects the low level signal terminal to be connected to the first input unit, the second level selecting unit selects the high level signal terminal to be connected to the second input unit, and the third level selecting unit selects the high level signal terminal to be connected to the inverting unit, when the gate driving signal output from the next stage of shift register is input to the second input unit of the current stage of shift register, the second input unit controls the voltage at the pulling-up node to be at a high level, the clock control unit controls the clock signal to be insulated from the output terminal of the current stage of shift register, and the pulling-down unit discharges the output terminal of the current stage of shift register, when the gate driving signal output from the previous stage of shift register is input to the first input unit, the first input unit controls the voltage at the pulling-up node to be at a low level, the clock control unit controls the clock signal to be insulated from the output terminal of the current stage of shift register, and the pulling-down unit discharges the output terminal of the current stage of shift register, after the output terminal of the previous stage of shift register is input to the first input unit, the clock control unit insulates the clock signal from the output terminal of the current stage of shift register, and the pulling-down unit discharges the output terminal of the current stage of shift register.

* * * * *